(12) United States Patent
Han

(10) Patent No.: US 8,526,640 B2
(45) Date of Patent: Sep. 3, 2013

(54) APPARATUS AND METHOD FOR SWITCHING AUDIO AMPLIFICATION

(75) Inventor: Yang-Yuan Han, Hsin-Chu (TW)

(73) Assignee: Modiotek Co., Ltd., Hsinchu (TW)

( * ) Notice: Subject to any disclaimer, the term of this patent is extended or adjusted under 35 U.S.C. 154(b) by 361 days.

(21) Appl. No.: 12/868,242

(22) Filed: Aug. 25, 2010

(65) Prior Publication Data

US 2012/0049930 A1 Mar. 1, 2012

(51) Int. Cl.
*H03F 99/00* (2009.01)
(52) U.S. Cl.
USPC ............... 381/120; 381/28; 330/10; 330/251
(58) Field of Classification Search
USPC .................. 381/28, 120; 330/10, 251, 291
See application file for complete search history.

(56) References Cited

U.S. PATENT DOCUMENTS

2005/0253648 A1* 11/2005 Shin ............................... 330/10

* cited by examiner

*Primary Examiner* — Disler Paul
(74) *Attorney, Agent, or Firm* — McClure, Qualey & Rodack, LLP

(57) ABSTRACT

Apparatus and method for switching audio amplification. In an embodiment, an apparatus for switching audio amplification includes an output circuit. The output circuit is coupled to a plurality of different voltage potentials and a first voltage potential, and outputs an output signal to drive a load, wherein each of the different voltage potentials is greater than the first voltage potential. In an exemplary embodiment, a control circuit controls the output circuit to generate the output signal based on one of the different voltage potentials and first voltage potential selectively so as to enable the output signal to switch between any two adjacent corresponding voltage levels of the different voltage potentials and the first voltage potential.

9 Claims, 7 Drawing Sheets

APPARATUS AND METHOD FOR SWITCHING AUDIO AMPLIFICATION

BACKGROUND OF THE INVENTION

1. Field of the Invention

The invention relates in general to an apparatus and method for switching audio amplification, and more particularly to an apparatus and method for switching audio amplification with multi-level pulse width modulation.

2. Description of the Related Art

A Class D amplifier or switching amplifier is an electronic amplifier where all power devices (usually MOSFETs) are operated as binary switches, thus significantly reducing the power losses and achieving high efficiencies. A conventional class D amplifier drives a speaker according to a pulse width modulated (PWM) waveform switching between a voltage level (VDD) and ground. Such switching of voltage level is likened to square wave operation and thus leads to electromagnetic interference (EMI) problem. The class D amplifier conventionally includes a filter such as a LC filter or low pass filter to filter out the undesirable harmonics in order to reduce the EMI noise. However, the inclusion of filter will inevitably increase the total cost and result in a larger chip size which will occupy larger area on the printed circuit board on which the class D amplifier is disposed.

SUMMARY OF THE INVENTION

The invention is directed to an apparatus and method for switching audio amplification with multi-level pulse width modulation.

According to a first aspect of the invention, an apparatus for switching audio amplification is provided. The apparatus includes a plurality of first switching devices, a plurality of second switching devices, a third switching device, and a fourth switching device. Each of the first switching devices is coupled between a first output terminal and a respective one of a plurality of different voltage potentials and has a corresponding control terminal. Each of the second switching devices is coupled between a second output terminal and a respective one of the different voltage potentials and has a corresponding control terminal. The third switching device, coupled between the first output terminal and a first voltage potential, has a corresponding control terminal, wherein each of the different voltage potentials is greater than the first voltage potential. The fourth switching device, coupled between the second output terminal and the first voltage potential, has a corresponding control terminal, wherein each of the first and second output terminals provides a corresponding voltage level of the different voltage potentials.

According to a second aspect of the invention, an apparatus for switching audio amplification is provided. The apparatus includes an output circuit and a control circuit. The output circuit, coupled to a plurality of different voltage potentials and a first voltage potential, outputs an output signal to drive a load, wherein each of the different voltage potentials is greater than the first voltage potential. The control circuit controls the output circuit to generate the output signal based on one of the different voltage potentials and first voltage potential selectively so as to enable the output signal to switch between any two adjacent corresponding voltage levels of the different voltage potentials and the first voltage potential.

According to a third aspect of the invention, a method for switching audio amplification is provided. The method includes the following steps. An output circuit outputting an output signal is provided, coupled to a plurality of different voltage potentials and a first voltage potential, wherein each of the different voltage potentials is greater than the first voltage potential. The output circuit is controlled to generate the output signal based on one of the different voltage potentials and first voltage potential selectively so as to enable the output signal to switch between any two adjacent corresponding voltage levels of the different voltage potentials and the first voltage potential.

The above and other aspects of the invention will become better understood with regard to the following detailed description of the preferred but non-limiting embodiment(s). The following description is made with reference to the accompanying drawings.

DETAILED DESCRIPTION OF THE INVENTION

The invention is directed to a switching audio amplification using multi-level pulse width modulation. In an exemplary embodiment, an output circuit is powered by multiple power signals, which exemplifies an output stage for a switching audio amplifier using multi-level pulse width modulation (PWM). An embodiment of a control signal generating unit is provided to drive the output stage. In addition, an embodiment exemplifies a switching audio amplifier using multi-level pulse width modulation with the output stage controlled by the control signal generating device.

First Embodiment

Figure 1:
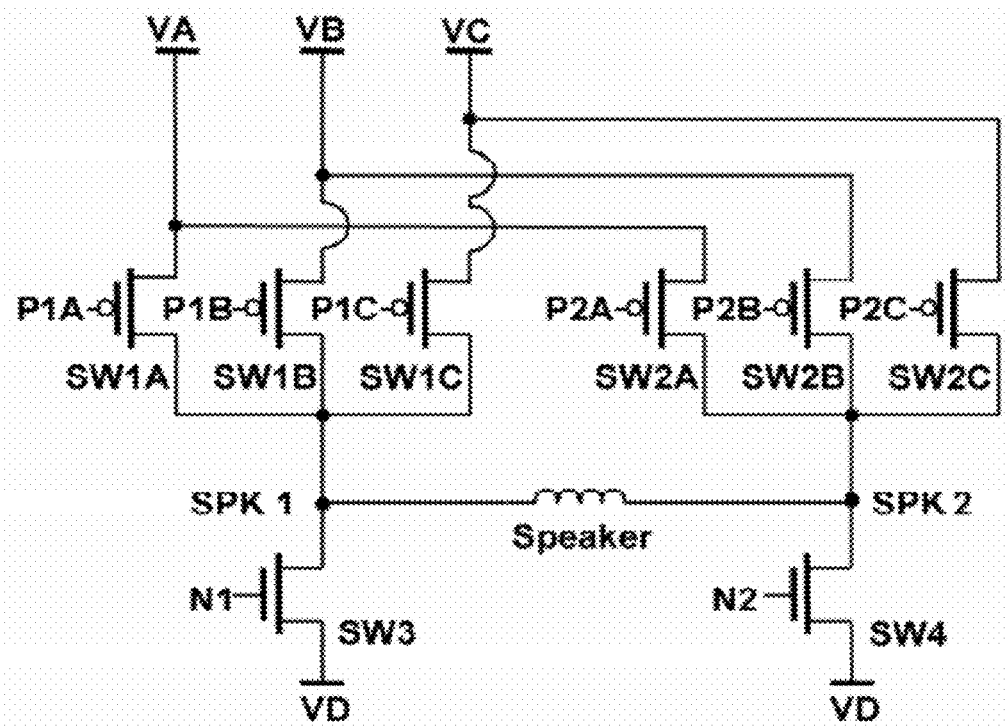
FIG. 1 shown an output circuit powered by multiple power signals according to a first embodiment.

Referring to FIG. 1, an output circuit is powered by multiple power signals according to a first embodiment. This exemplifies an output stage for a switching audio amplifier using multi-level pulse width modulation. In FIG. 1, an output circuit 10 is powered by multiple power signals, e.g., two or more different power signals such as power signals at voltage levels VA, VB, and VC. The output circuit 10 can be used to drive a speaker load coupled between nodes SPK1 and SPK2 with multiple voltage levels, such as three or more voltage levels, by way of differential signaling. As an example, a multi-level pulse width modulated waveform shown in FIG. 2B switches among four voltage levels, such as VD (e.g. ground), VC, VB, and VA, substantially, at the node SPK1 or SPK2.

Figure 2A:
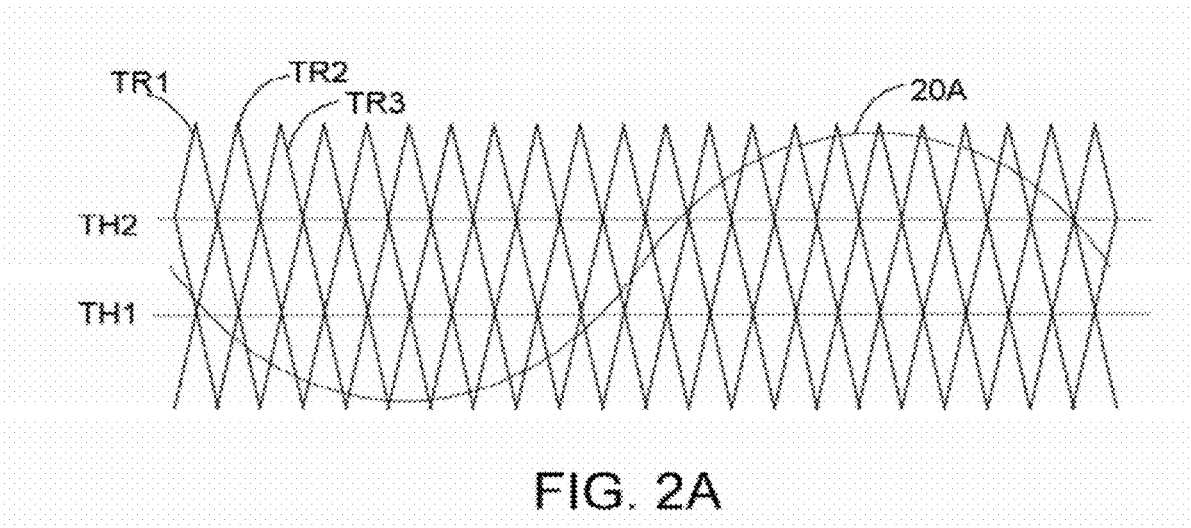
FIG. 2A illustrates an exemplary multi-phase PWM scheme.
Figure 2B:
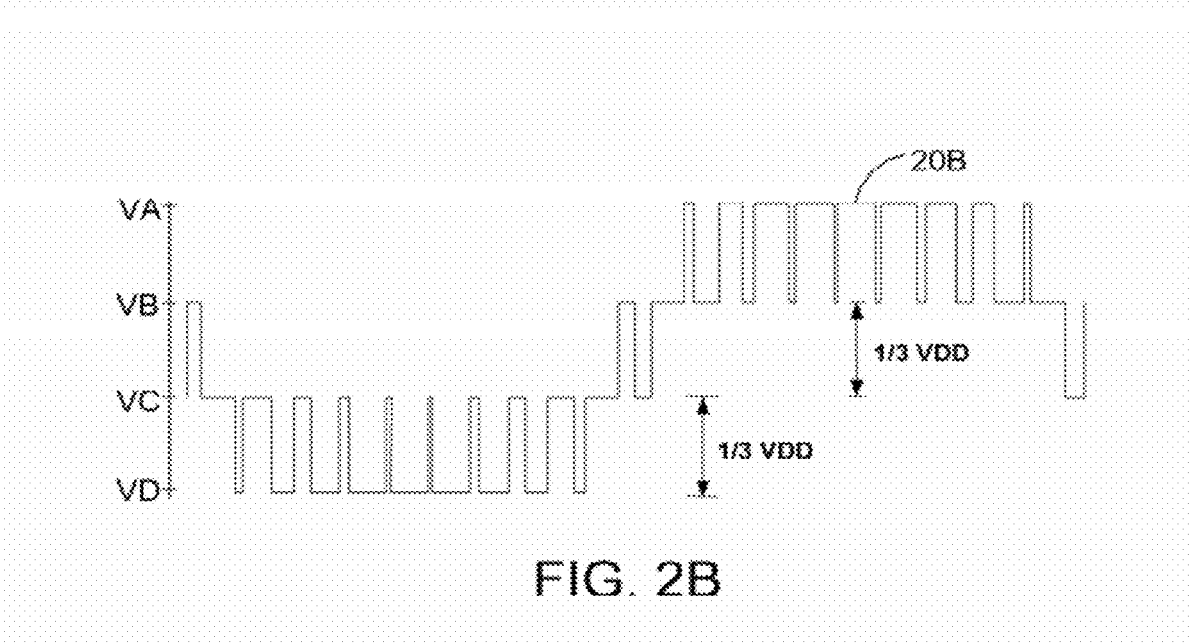
FIG. 2B shows a multi-level PWM waveform by the multi-phase PWM scheme as illustrated in FIG. 2A.

In order for the node SPK1 to produce an output signal, e.g., as illustrated in FIG. 2B, the output circuit 10 in FIG. 1 includes a first group of switching devices SW1A-SW1C and SW3, e.g., switching transistors such as PMOS or NMOS, or other transistors, or combination of transistors or controllable switches, each of which is coupled between a corresponding voltage level and the node SPK1. As exemplified in FIG. 1, the switch SW1A is coupled between the voltage level VA and the node SPK1; the switch SW1B is coupled between the voltage level VB and the node SPK1; and the switch SW1C is coupled between the voltage level VC and the node SPK1. In addition, the switch SW3 is coupled between the node SPK1 and a voltage level VD, e.g. ground, or a positive or negative voltage level, wherein in terms of magnitude, VA>VB>VC>VD. Likewise, in order for the node SPK2 to produce an output signal that is a complementary signal (i.e., one of the differential pair) of that at the node SPK1, the output circuit 10 further includes a second group of switching devices, e.g., SW2A-SW2C and SW4, each of which is coupled between a corresponding voltage level, i.e., VA, VB, VC, or VD, and the node SPK2.

In addition, each of the switching devices in FIG. 1 has a corresponding control terminal. The first group of switching devices are configured to be controlled through the corresponding control terminals and one of the first group of switching devices is enabled and the others are disabled so as to produce an output signal, e.g., as illustrated in FIG. 2B, at the node SPK1. Likewise, the second group of switching devices are also configured to be controlled through the corresponding control terminals so as to produce an output signal that is a complementary signal of the one at the node SPK1.

As can be observed according to the exemplary waveform in FIG. 2B, for the node SPK1, the first group of switching devices in FIG. 1 can be controlled in a switching sequence so as to allow switching of voltage level between any two adjacent voltage levels, e.g., VA and VB; VB and VC; VC and VD, along with time. The same principle is also applicable for the node SPK2. Accordingly, the output circuit 10 can be regarded as an output stage for a switching audio amplifier using multi-level PWM, where low switching noise can be achieved due to reduced voltage switching levels.

In other embodiments, an output circuit can also be derived from the principle of structure of the present embodiment in order to generate an output signal of three-, five- or more level PWM signal, wherein the number of switches of the first or second groups of switching devices can be adapted according to the number of voltage levels that the output signal will have. In addition, the more output levels the output circuit uses, the more different voltages the output signal of the output circuit can switch among. The more different voltages be switching, the less voltage jump between the voltage levels of the discontinuous waveform and the less switching noise. Thus, this output circuit 10 for use in a switching audio amplifier using multi-level PWM can result in reduced EMI noise. This technique can keep the output common-mode constant and can remove a major contribution of radiated emissions.

In addition to that, this approach having more encoding level can obtain more accuracy resolution and more high performance quality of SNR parameter than traditional class D amplifier switching in binary code.

Second Embodiment

Figure 3:
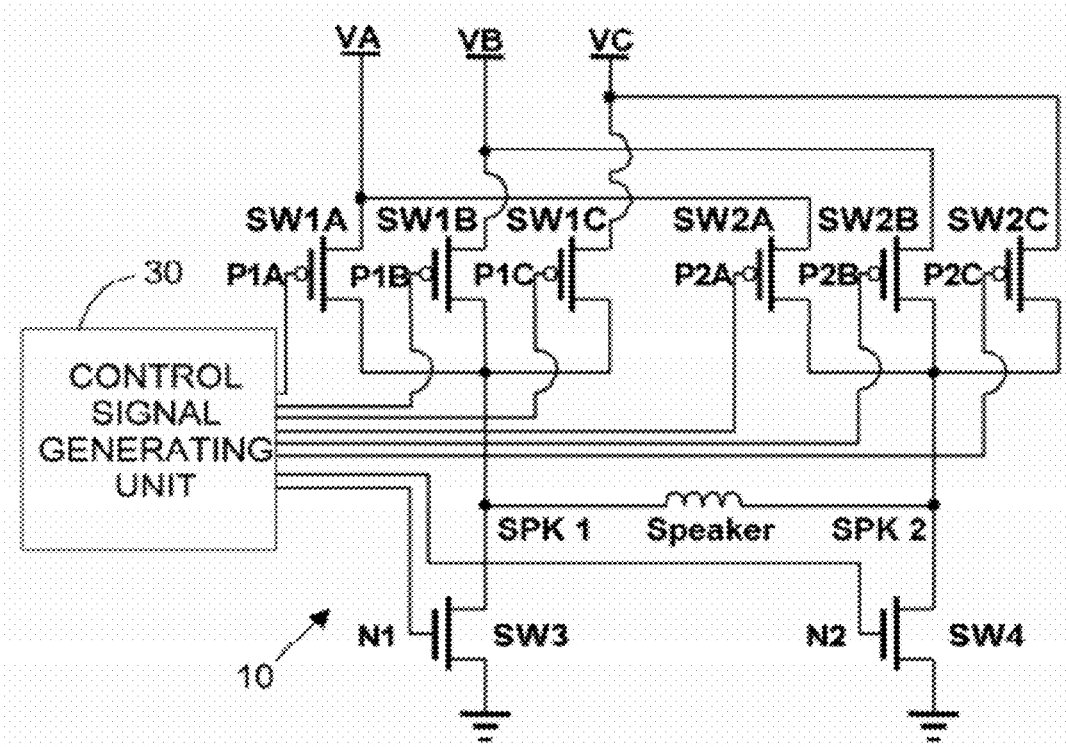
FIG. 3 shows a control signal generating unit to drive the output circuit in FIG. 1 according to a second embodiment.

Referring to FIG. 3, a control circuit such as a control signal generating unit 30 is provided to drive the output circuit 10 for a switching audio amplifier using multi-level PWM according to a second embodiment. As an exemplary embodiment, FIG. 3 indicates that the control signal generating unit 30 provides a number of control signals to the control terminals P1A-P1C, N1, P2A-P2C, and N2 of the output circuit 10 in a switching sequence corresponding to an audio signal converted according to a multi-phase PWM scheme. Further, the output circuit 10 can be utilized for this purpose independent of the implementation of the scheme for the multi-level PWM.

Figure 4A:
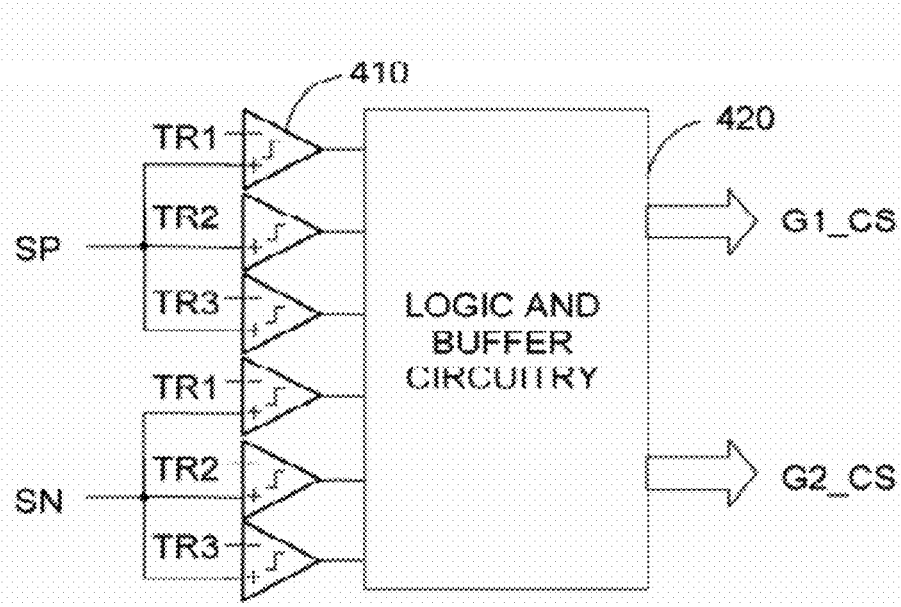
FIGS. 4A and 4B illustrate examples of implementation of the control signal generating unit of FIG. 3.

FIG. 4A indicates an embodiment of the control signal generating unit 30 that implements a scheme for the multi-level PWM, as illustrated in FIGS. 2A and 2B. In FIG. 4A, the control signal generating unit 40 encodes an input signal SP, e.g., an audio signal or a processed audio signal, and its complementary signal SN into two groups of control signals, denoted by G1_CS and G2_CS, respectively. The two groups of control signals are applied to the control terminals of the two groups of switching devices of the output circuit 10 so as to generate a multi-level PWM waveform, as exemplified in FIG. 2B. Referring to FIG. 4A, the control signal generating unit 40 includes a number of comparators (CMP) 410 and logic and buffer circuitry 420. The comparators 410 can be regarded as a comparing unit and divided into two portions of circuitry for the signals SP and SN.

Figure 4B:
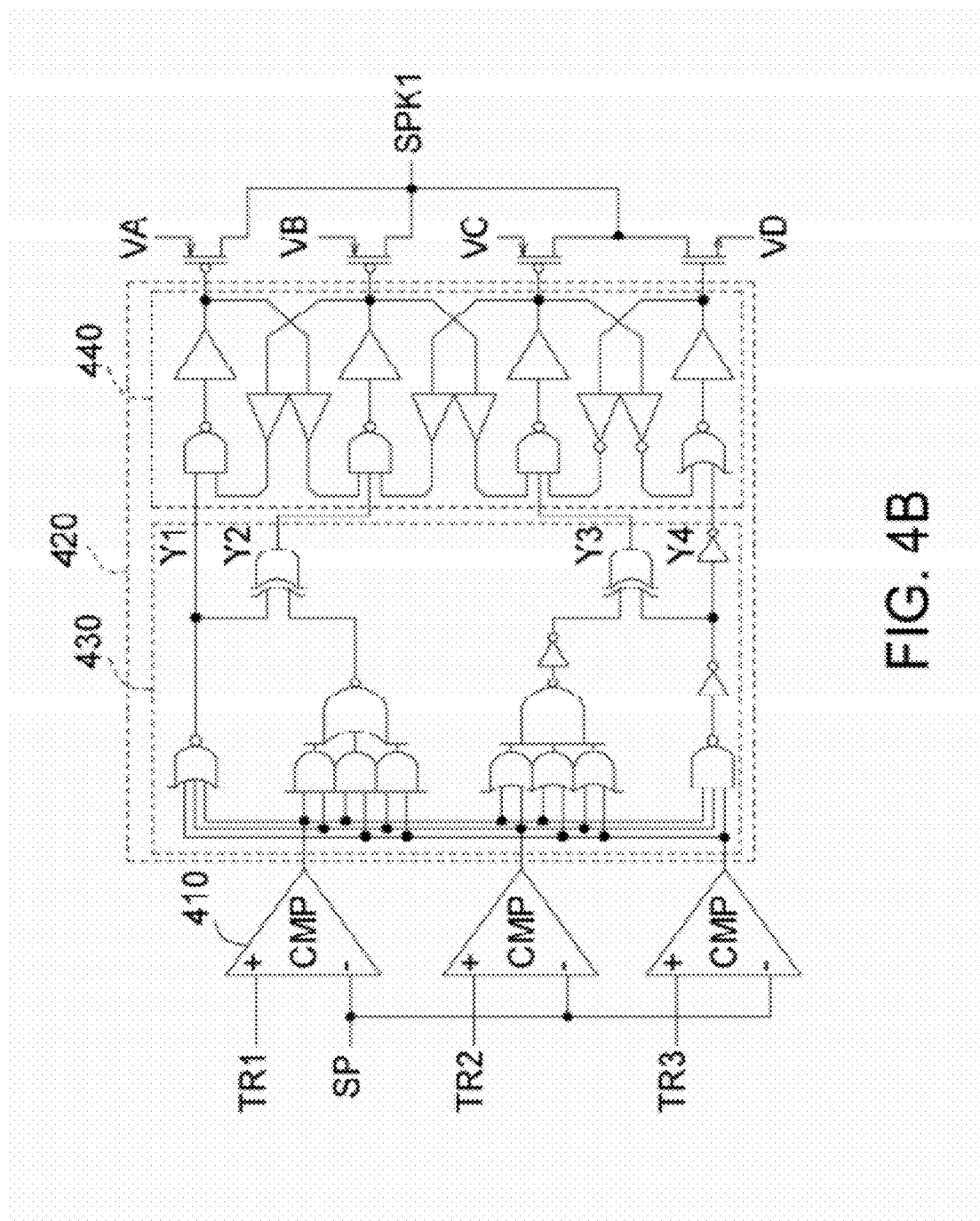

For the sake of brevity, a portion of circuitry for processing the signal SP is illustrated in FIG. 4B in reference with the scheme indicated in FIGS. 2A and 2B. In FIG. 4B, an example of the logic and buffer circuitry 420 can be implemented as a logic circuit 430 with logic gates and a delay buffer 440. Referring to FIG. 2A, three triangle signals TR1, TR2, and TR3 with same phase delay between two adjacent triangle signals are compared with an input signal 20A to generate a group of control signals G1_CS for controlling the first group of switching devices, i.e., SW1A-SW1C and SW3. Referring to FIGS. 2A, 2B, and 4B, the three triangle signals TR1, TR2, and TR3 alternate cycle by cycle and are compared with the input signal 20A (SP) by the comparators 410. In FIG. 2A, the three triangle signals implies two thresholds TH1 and TH2 and three regions in terms of the amplitude, i.e., lower region (below TH1), middle region (between TH1 and TH2), and upper region (above TH2) for comparison. In FIG. 4B, the logic circuit 430 uses the comparison results from the comparators 410 to check whether the input signal 20A (SP) falls within the three regions. As can be observed, when the input signal 20A falls within the lower region, i.e., below the threshold TH1, the PWM waveform 20B, as illustrated in FIG. 2B, switches between VC and VD. When the input signal 20A falls within the middle region, i.e., between the thresholds TH1 and TH2, the PWM waveform 20B switches between VB and VC. When the input signal 20A falls within the upper region, i.e., above the threshold TH2, the PWM waveform 20B switches between VA and VB. The logic circuit 430, in response to different comparison results, outputs four output values, Y1-Y4, one of which indicates enabling of one of the first group of switching devices and others of which indicate disabling of the other switching devices. The delay buffer 440 is used for converting the logic outputs, i.e., Y1-Y4, from the logic circuit 430 into control signals that are suitable for controlling the switching devices, e.g. power switches, so as to generate the PWM waveform at the node SPK1. In other words, the control signals indicate switching of voltage levels of a corresponding multi-level pulse width modulation signal of the input signal 20A. In addition, the delay buffer 440 also performs dead-time control to avoid switching lose among switching devices, such as MOS switches.

Likewise, a portion of the circuit for processing the signal SN can be derived from the above example, as shown in FIG. 4B and will not be discussed for the sake of brevity.

Third Embodiment

Figure 5:
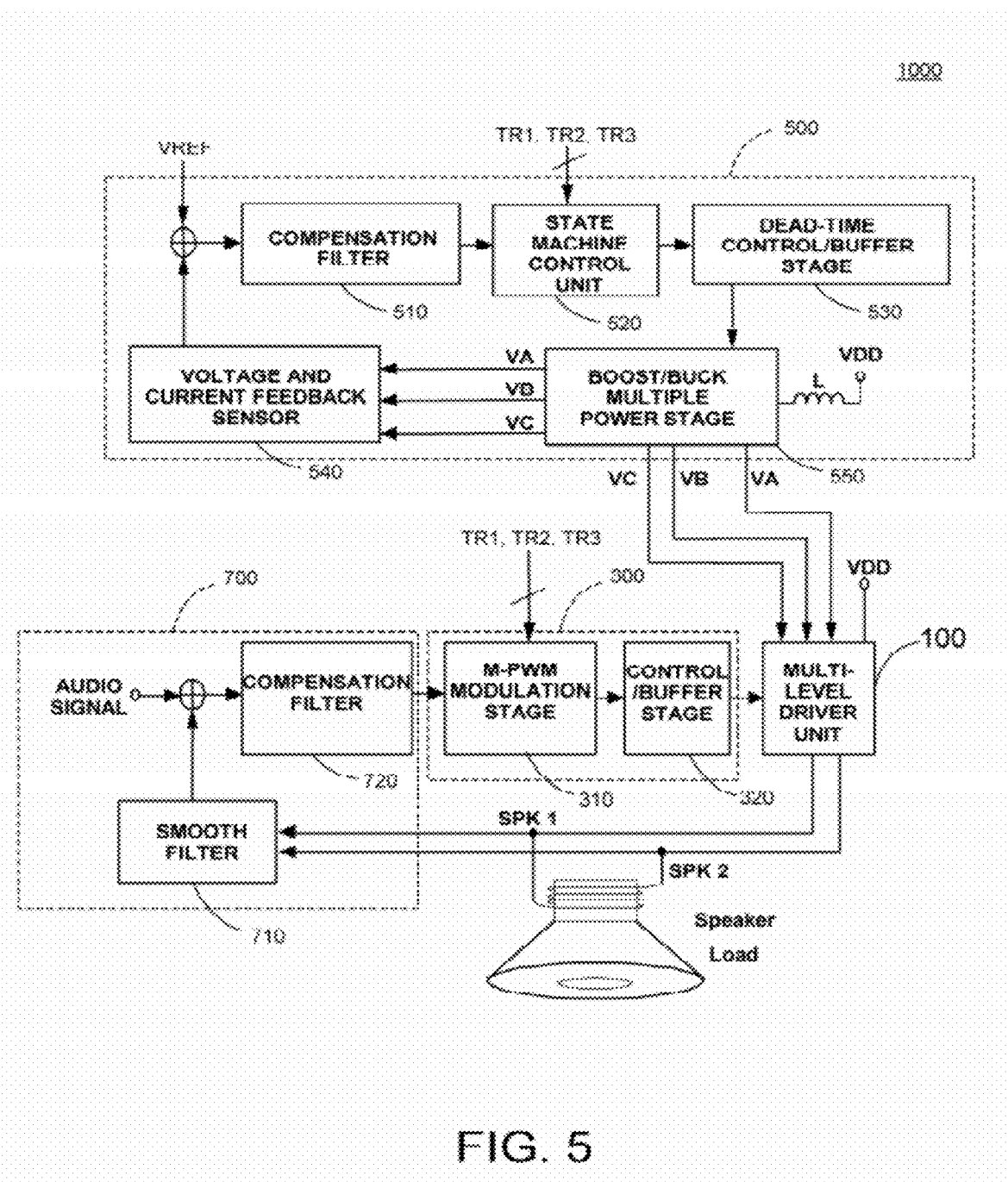
FIG. 5 is a block diagram illustrating a switching audio amplifier according to a third embodiment.

Referring to FIG. 5, a switching audio amplifier 1000 is provided according to a third embodiment, using multi-level pulse width modulation with an output stage, such as the one illustrated in FIG. 1, controlled by a control signal generating unit, such as the one illustrated in FIG. 3. The switching audio amplifier 1000 includes a multi-level driving unit 100, a multi-level PWM unit 300, a power management unit (PMU) 500, and a noise shaping filtering unit 700.

The multi-level driving unit 100 can be implemented according to the output circuit 10 of the first embodiment. The multi-level PWM unit 300 can be the control signal generating unit 30 as exemplified above or other implementation for a multi-level PWM scheme. For example, the multi-level PWM unit 300 includes a M-PWM modulation stage 310 and a control/buffer stage 320. Further, the multi-level PWM unit 300 can be realized by a control circuit or unit such as a microcontroller, a digital processing unit, or other programmable logic circuitry.

The power management unit (PMU) 500 can be implemented by a DC-DC converter that can supply multiple output voltages. For example, this DC-DC converter can use one inductance to store energy from a power source (denoted by VDD) and re-distribute this energy as voltage levels of VA, VB and VC. This PMU have power boost ability and these multiple output voltages (VA, VB or VC) can be higher than VDD to drive speaker load. As exemplified in FIG. 5, a power management unit 500 can include a compensation filter 510, a state machine control unit 520, a dead-time control/buffer stage 530, a voltage and current feedback sensor 540, and a boost/buck multiple power stage 550 and an inductor L. This power management unit 500 can use a reference voltage VREF from a bandgap reference voltage and triangle waves TR1, TR2, and TR3 from a system that the switching audio amplifier 1000 is disposed. In another example, the switching audio amplifier 1000 can be implemented with a built-in reference signal generating unit for generating these voltages VREF and TR1-TR3.

Figure 6:
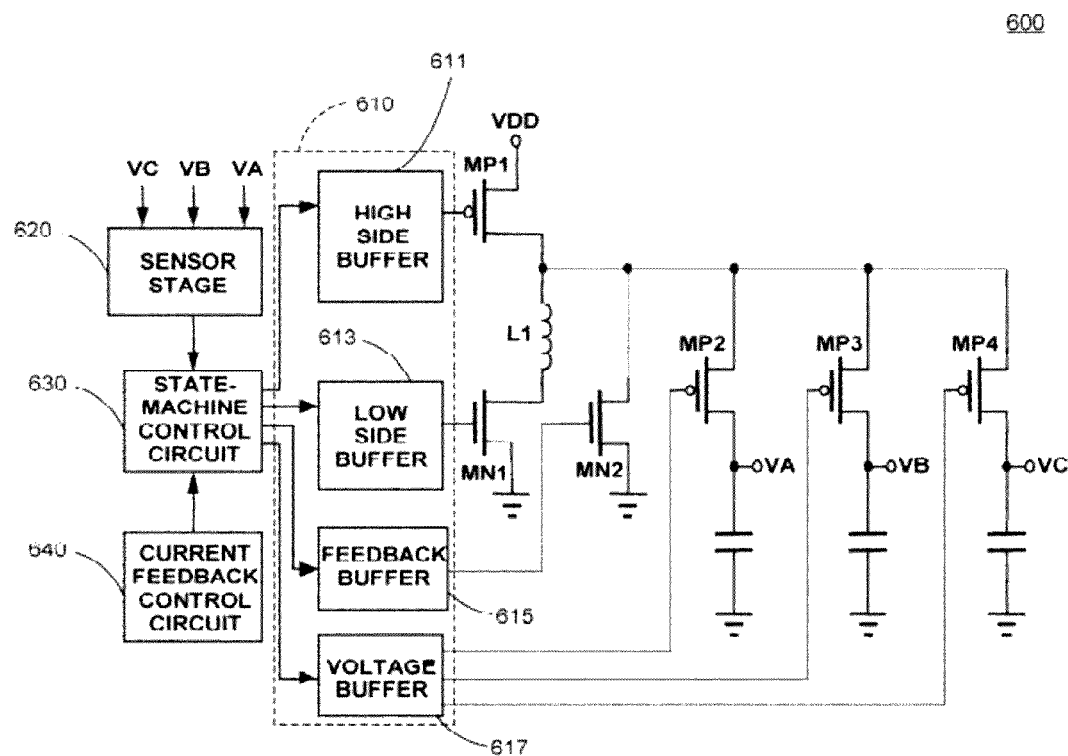
FIG. 6 shows a schematic diagram of an example of a power management unit in FIG. 5.

As another example, referring to FIG. 6, the PMU 600 includes an inductor L1, power MOS MP1-4, MN1-2, buffer stage 610, sensor stage 620, current feedback control circuit 630 and a state-machine control circuit 640, wherein the buffer stage 610 includes a high side buffer 611, a low side buffer 613, a feedback buffer 615, and a voltage buffer 617.

Usually the power source for some portable product is Li-battery supplying voltage only about 4.2V-3.3V. But such voltage cannot satisfy the requirement of output driving power in newer application. The present embodiment includes a power engine, which includes boost-buck DC-DC converter with one inductance that could output multiple-voltage and much higher voltage than VDD. In this way, the speaker can be driven more loudly than traditional class D amplifier.

Figure 7:
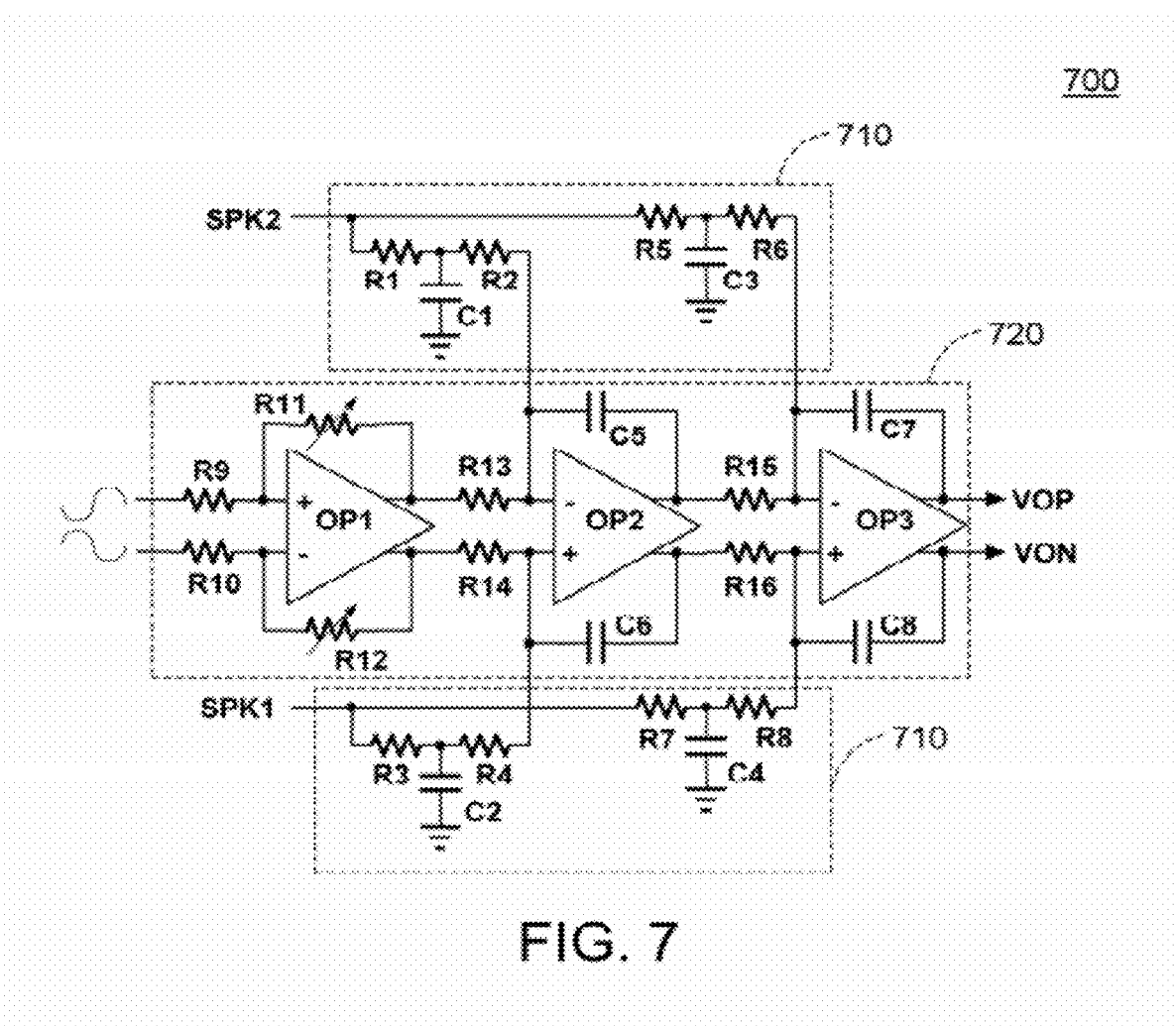
FIG. 7 shows a schematic diagram of an example of a noise shaping filtering unit in FIG. 5.

In FIG. 5, a noise shaping filtering unit 700 includes a smooth filter 710 and a compensation filter 720. Referring to FIG. 7, an example of a noise shaping filtering unit 700 is shown. The noise shaping filtering unit 700 includes a number of operating amplifiers OP1, OP2, OP3, resistances R1-R12 and capacitors C1-08 and is for filtering to reduce noise and distortion of the input audio signal when sampling or driving output. The noise shaping filtering unit 700 includes an input gain stage with OP1; second order integrator with OP2 and OP3; and a pair of smooth filters 710. The noise shaping filtering unit 700 filters high frequency noise of an input audio signal, e.g., in differential signaling, and to output VOP and VON signals as inputs to the multi-level PWM unit 300. The SPK1 and SPK2 signals in FIG. 7 are the output signals of the multi-level driving unit 100. In other examples, first order or other order noise shaping filtering unit can also be used.

The examples of circuits as shown in FIGS. 5, 6 and 7 are for illustration only and not restrict the implementation of the third embodiment. Any switching audio amplifier using multi-level driving unit, as illustrated in FIG. 1, with multi-level PWM (3-level or above) can be regarded as an implementation of the present embodiment. Besides, the output circuit 10 can be utilized for this purpose independent of the implementation of the scheme for the multi-level PWM. That is, the scheme for the multi-level PWM other than the one illustrated in FIGS. 2A and 2B can also be used to implement the above embodiment. For examples, the modulation carriers can be square or sawtooth waveform with different phases other than triangle waves or the number of carriers or phases of the carriers can also be adjustable. In other examples, the noise shaping filtering unit can be regarded as optional or omitted or can be substituted by other noise filtering structure of different order.

Furthermore, based on the above embodiments, a method for switching audio amplification is provided as the following. First, an output circuit outputting an output signal is provided, wherein the output circuit is coupled to a plurality of voltage potentials including first, second, and third voltage potentials, and the third voltage potential is greater than the second voltage potential, and the second voltage potential is greater than the first voltage potential. The output circuit is controlled to generate the output signal based on one of the voltage potentials selectively so as to enable the output signal to switch between two adjacent voltage levels according to the voltage potentials. A load, e.g., an audio load such as a speaker, a headphone, an audio port, or an audio input, is driven according to the output signal. As exemplified, the controlling step can be implemented by the control signal generating unit 30, as shown in FIG. 3, and the driving step can be implemented by the output circuit 10, as shown in FIG. 1, wherein the multi-level pulse width modulated signal switches among three or four or above levels and the voltage levels can be three or above. As can be seen from the above embodiments, the method can be implemented using different structure of circuitry. Also, the output circuit can be implemented in a single-ended manner as well as differential signaling.

As above described, the exemplary embodiments directed to switching audio amplification using multi-level pulse width modulation are provided. In an exemplary embodiment, an output circuit is coupled to multiple power signals, which exemplifies an output stage for a switching audio amplifier using multi-level pulse width modulation (PWM). The embodiment allows for eliminating the inclusion of a filter in the output terminals for driving audio load. In practical applications, this leads to a reduced chip area for the implementation of a switching audio amplifier. In addition, the output circuit can be utilized for this purpose independent of the implementation of the scheme for the multi-level PWM. This results in a flexibility of design of the switching audio amplifier. For the third embodiment, a switching audio amplifier with higher efficiency can be implemented in reduced area and cost.

While the invention has been described by way of examples and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for switching audio amplification comprising:
   a plurality of first switching devices each of which is coupled between a first output terminal and a respective one of a plurality of different voltage potentials, each of the first switching devices having a corresponding control terminal;
   a plurality of second switching devices each of which is coupled between a second output terminal and a respective one of the different voltage potentials, each of the second switching devices having a corresponding control terminal;
   a third switching device, coupled between the first output terminal and a first voltage potential, having a corresponding control terminal, wherein each of the different voltage potentials is greater than the first voltage potential;
   a fourth switching device, coupled between the second output terminal and the first voltage potential, having a corresponding control terminal, wherein each of the first and second output terminals provides a corresponding voltage level of the different voltage potentials; and
   a control signal generating circuit, coupled to the control terminals, for multi-level pulse width modulating the first and second switching devices to generate a differential signal between the first and second output terminals.

2. The apparatus according to claim 1, wherein the control signal generating circuit enables one of the first switching devices selectively so as to switch voltage level at the first output terminal between any two adjacent corresponding voltage levels of the different voltage potentials and the first voltage potential.

3. The apparatus according to claim 2, wherein the control signal generating circuit enables one of the second switching devices selectively so as to switch voltage level at the second output terminal between any two adjacent corresponding voltage levels of the different voltage potentials and the first voltage potential.

4. The apparatus according to claim 1, wherein the control signal generating circuit comprises:
   a comparing unit, coupled to an input signal and a plurality of multi-phase carriers;
   a logic circuit, coupled to the comparing unit, for outputting a plurality of logic output signals according to outputs from the comparing unit; and
   a buffer, coupled to the logic circuit, for providing a plurality of control signals to enable one of the first switching devices selectively and one of the second switching devices selectively, according to the logic output signals, so as to generate the differential signal between the first and second output terminals.

5. The apparatus according to claim 1, wherein the control signal generating circuit comprises:
   a noise shaping filtering circuit, coupled to the first and second output terminals, for outputting at least a filtered signal to the control signal generating unit according to an audio signal.

6. An apparatus for switching audio amplification, comprising:
   an output circuit, coupled to a plurality of different voltage potentials and a first voltage potential, for outputting an output signal to drive a load, wherein each of the different voltage potentials is greater than the first voltage potential; and
   a control circuit for controlling the output circuit to generate the output signal based on one of the different voltage potentials and first voltage potential selectively so as to enable the output signal to switch between any two adjacent corresponding voltage levels of the different voltage potentials and the first voltage potential, wherein the control circuit converts an input signal into a plurality of control signals according to a plurality of multi-phase carrier signals, wherein the output circuit is controlled to generate the output signal according to the control signals, the control circuit comprises:
   a comparing unit to compare the input signal with the multi-phase carrier signals to generate a plurality of comparison results; and
   a converting unit to convert the comparison results into the control signals indicating switching of voltage levels of a corresponding multi-level pulse width modulation signal of the input signal.

7. The apparatus according to claim 6, wherein the output circuit comprises:
   a plurality of first switching devices each of which is coupled between a first output terminal and a respective one of the different voltage potentials, each of the first switching devices having a corresponding control terminal; and
   a third switching device, coupled between the first output terminal and the first voltage potential, having a corresponding control terminal, wherein the first output terminal provides a corresponding voltage level of the different voltage potentials.

8. The apparatus according to claim 7, wherein the output circuit further comprises:
   a plurality of second switching devices each of which is coupled between a second output terminal and a respective one of the different voltage potentials, each of the second switching devices having a corresponding control terminal; and
   a fourth switching device, coupled between the second output terminal and the first voltage potential, having a corresponding control terminal, wherein the second output terminal provides a corresponding voltage level of the different voltage potentials.

9. A method for switching audio amplification, comprising:
   providing an output circuit outputting an output signal, coupled to a plurality of different voltage potentials and a first voltage potential, wherein each of the different voltage potentials is greater than the first voltage potential;
   controlling the output circuit to generate the output signal based on one of the different voltage potentials and first voltage potential selectively so as to enable the output signal to switch between any two adjacent corresponding voltage levels of the different voltage potentials and the first voltage potential; and
   converting an input signal into a plurality of control signals according to a plurality of multi-phase carrier signals;
   wherein the output circuit is controlled to generate the output signal according to the control signals, and the converting step comprises:
   comparing the input signal with the multi-phase carrier signals to generate a plurality of comparison results; and
   converting the comparison results into the control signals indicating switching of voltage levels of a corresponding multi-level pulse width modulation signal of the input signal.

* * * * *